United States Patent
Randazzo et al.

(10) Patent No.: US 8,153,985 B2
(45) Date of Patent: Apr. 10, 2012

(54) NEUTRON DETECTOR CELL EFFICIENCY

(75) Inventors: Todd Andrew Randazzo, Mound, MN (US); Bradley J. Larsen, Mound, MN (US); Paul S. Fechner, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 195 days.

(21) Appl. No.: 12/536,950

(22) Filed: Aug. 6, 2009

(65) Prior Publication Data

US 2011/0089331 A1  Apr. 21, 2011

Related U.S. Application Data

(60) Provisional application No. 61/148,448, filed on Jan. 30, 2009.

(51) Int. Cl.
G01T 1/16 (2006.01)
(52) U.S. Cl. .................................. 250/370.05
(58) Field of Classification Search ............. 250/370.05
See application file for complete search history.

(56) References Cited

U.S. PATENT DOCUMENTS

| | | | |
|---|---|---|---|
| 4,419,578 A | 12/1983 | Kress | |
| 4,445,036 A | 4/1984 | Selph | |
| 4,609,520 A | 9/1986 | Kronenberg | |
| 4,737,234 A | 4/1988 | Ruddy | |
| 4,757,202 A | 7/1988 | East | |
| 4,874,951 A | 10/1989 | Gold et al. | |
| 5,281,822 A | 1/1994 | Albrecht et al. | |
| 5,315,544 A | 5/1994 | Yokote et al. | |
| 5,319,210 A | 6/1994 | Moscovitch | |
| 5,444,301 A | 8/1995 | Song et al. | |
| 5,562,769 A | 10/1996 | Dreifus et al. | |
| 5,726,453 A | 3/1998 | Lott et al. | |
| 5,940,460 A | 8/1999 | Seidel et al. | |
| 5,969,359 A | 10/1999 | Ruddy et al. | |
| 6,005,795 A * | 12/1999 | Hawkins et al. ............ 365/156 |
| 6,075,261 A | 6/2000 | Hossain et al. | |
| 6,252,923 B1 | 6/2001 | Iacovino et al. | |
| 6,388,260 B1 | 5/2002 | Doty et al. | |
| 6,542,565 B2 | 4/2003 | Ruddy et al. | |
| 6,596,998 B1 | 7/2003 | Siedel | |

(Continued)

FOREIGN PATENT DOCUMENTS
EP  0709854 A1  5/1998
(Continued)

OTHER PUBLICATIONS

J.C. Lund, F. Sinclair & G. Entine, Neutron Dosimeter Using a Dynamic Random Access Memory as a Sensor, 33 IEEE Transactions on Nuclear Science, Feb. 1986.

(Continued)

*Primary Examiner* — Constantine Hannaher
(74) *Attorney, Agent, or Firm* — Shumaker & Sieffert, P.A.

(57) ABSTRACT

Neutron detection cells and corresponding methods of detecting charged particles that make efficient use of silicon area are set forth. Three types of circuit cells/arrays are described: state latching circuits, glitch generating cells, and charge loss circuits. An array of these cells, used in conjunction with a neutron conversion film, increases the area that is sensitive to a strike by a charged particle over that of an array of SRAM cells. The result is a neutron detection cell that uses less power, costs less, and is more suitable for mass production.

16 Claims, 14 Drawing Sheets

U.S. PATENT DOCUMENTS

| | | | |
|---|---|---|---|
| 6,627,898 B2 | 9/2003 | Seidel et al. | |
| 6,714,616 B1 | 3/2004 | Kronenberg et al. | |
| 6,727,504 B1 | 4/2004 | Doty | |
| 6,765,978 B1 | 7/2004 | Kronenberg et al. | |
| 6,771,730 B1 | 8/2004 | Dowben | |
| 6,828,561 B2 * | 12/2004 | Layman et al. | 250/370.02 |
| 6,841,841 B1 | 1/2005 | Blish, II et al. | |
| 6,867,444 B1 | 3/2005 | Hughes | |
| 6,909,159 B2 | 6/2005 | Friend et al. | |
| 6,921,903 B2 | 7/2005 | McGregor | |
| 7,070,658 B2 | 7/2006 | Guido et al. | |
| 7,105,832 B2 | 9/2006 | Dai et al. | |
| 7,142,109 B1 | 11/2006 | Frank | |
| 7,164,596 B1 * | 1/2007 | Deng et al. | 365/154 |
| 7,265,359 B2 | 9/2007 | Ambrosi et al. | |
| 7,271,389 B2 | 9/2007 | August et al. | |
| 7,332,726 B2 | 2/2008 | Friedman | |
| 7,335,891 B2 | 2/2008 | Kniss et al. | |
| 7,372,009 B1 | 5/2008 | Losee et al. | |
| 7,465,937 B2 | 12/2008 | Fehrenbacher | |
| 7,491,948 B2 | 2/2009 | Gordon | |
| 7,514,694 B2 | 4/2009 | Stephan et al. | |
| 7,518,119 B2 | 4/2009 | Friedman et al. | |
| 7,572,392 B2 | 8/2009 | Clothier et al. | |
| 7,635,849 B2 | 12/2009 | Klein et al. | |
| 2004/0178337 A1 | 9/2004 | Kurkoski et al. | |
| 2004/0227094 A1 | 11/2004 | Tompa | |
| 2005/0071730 A1 | 3/2005 | Moyer | |
| 2005/0082489 A1 * | 4/2005 | August et al. | 250/370.05 |
| 2006/0255282 A1 | 11/2006 | Nikolic et al. | |
| 2007/0018110 A1 | 1/2007 | McGregor et al. | |
| 2008/0017804 A1 | 1/2008 | Krishnamoorthy et al. | |
| 2008/0165605 A1 | 7/2008 | Fisch | |
| 2008/0308747 A1 | 12/2008 | Gordon | |
| 2009/0057545 A1 | 3/2009 | Saenger et al. | |
| 2009/0302226 A1 | 12/2009 | Schieber et al. | |
| 2009/0302227 A1 | 12/2009 | Keyser et al. | |
| 2010/0019164 A1 | 1/2010 | Stephan et al. | |

FOREIGN PATENT DOCUMENTS

| | | |
|---|---|---|
| EP | 1729149 A1 | 12/2006 |
| JP | 54-141186 | 11/1979 |
| JP | 2002267760 | 9/2002 |
| JP | 2004-219165 | 8/2004 |
| WO | 0033106 A1 | 6/2000 |
| WO | 2005003816 A2 | 1/2005 |
| WO | 2005088719 A1 | 9/2005 |
| WO | 2006085307 A1 | 8/2006 |
| WO | 2005076779 A3 | 8/2008 |
| WO | 2008107017 A1 | 9/2008 |

OTHER PUBLICATIONS

Barthe, Jean. "Electronic Dosimeters Based on Solid State Detectors," Nuclear Instruments and Methods in Physics Research B 184 (2001) 158-189, 2001 Elsevier Science B.V.

Bartlett et al., "Active Neutron Personal Dosemeters—A Review of Current Status," Radiation Protection Dosimetry, vol. 86, No. 2, pp. 107-122 (1999) Nuclear Technology Publishing.

Robertson et al., "A Cross of Boron-Rich Solid-State Neutron Detectors," Applied Physics Letters. vol. 80, No. 19, 4 pages, May 13, 2002.

Shultis et al., "Efficiencies of Coated and Perforated Semiconductor Neutron Detectors," IEEE Transactions on Nuclear Science, vol. 53, No. 3, pp. 1659-1665, Jun. 2006.

Bruckner et al., "Position Sensitive Detection of Thermal Neutrons with Solid State Detectors (Gd Si Planar Detectors)", Nuclear Instruments and Methods in Physics Research A 424 (1999) pp. 183-189.

* cited by examiner

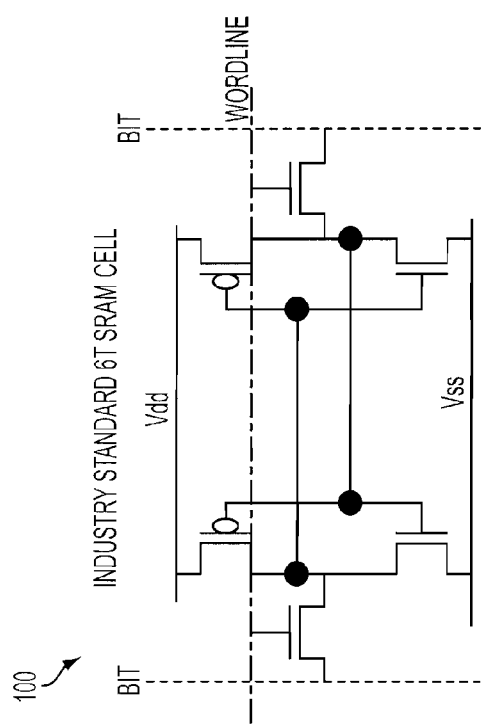
FIG. 1
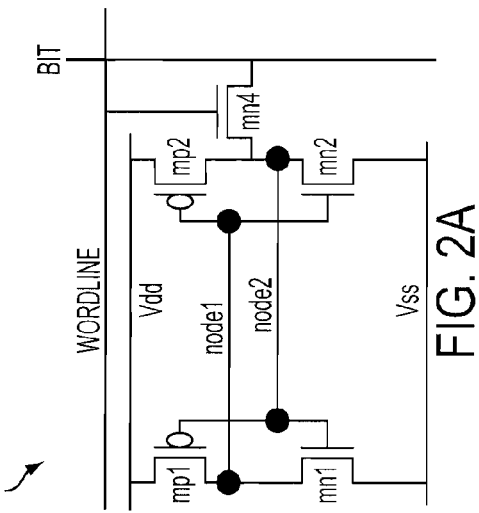
FIG. 2A
FIG. 2B

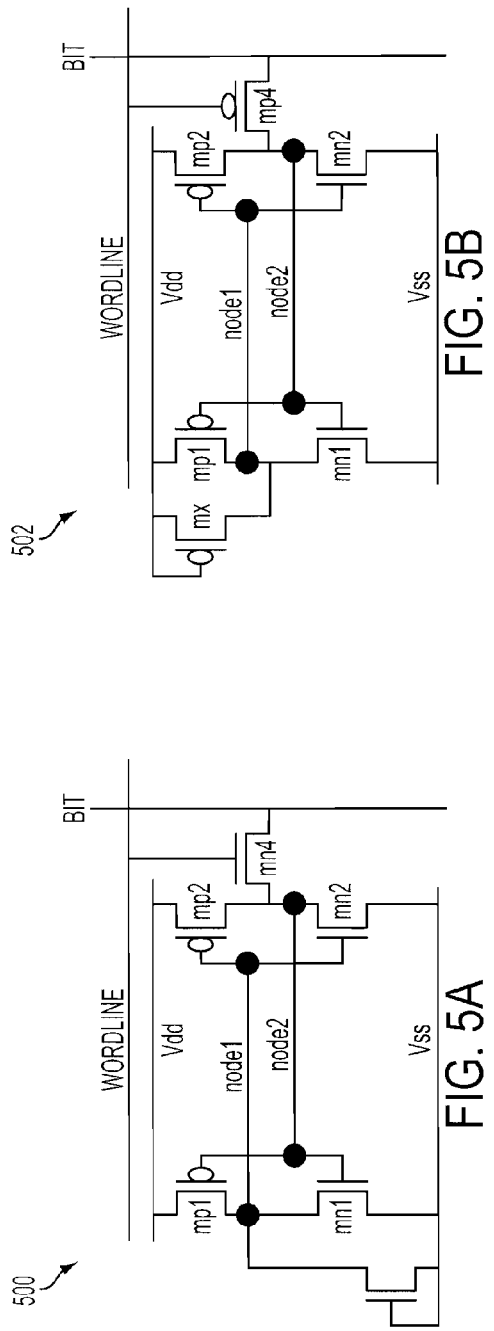
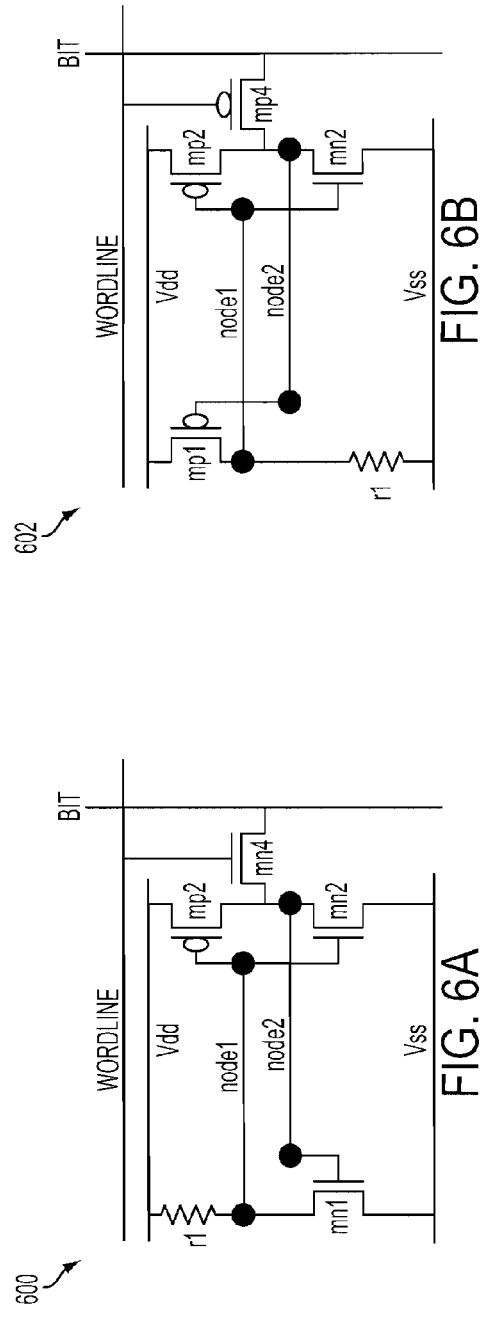
FIG. 5A
FIG. 5B
FIG. 6A
FIG. 6B

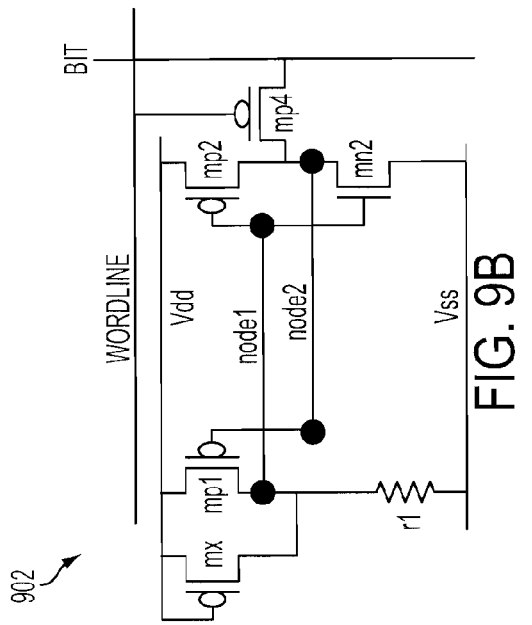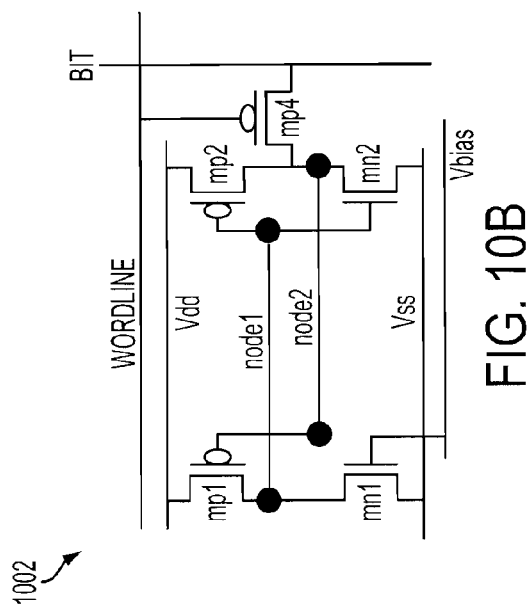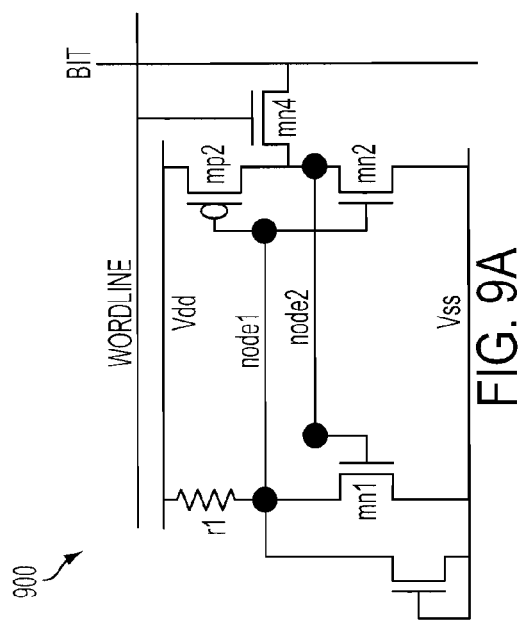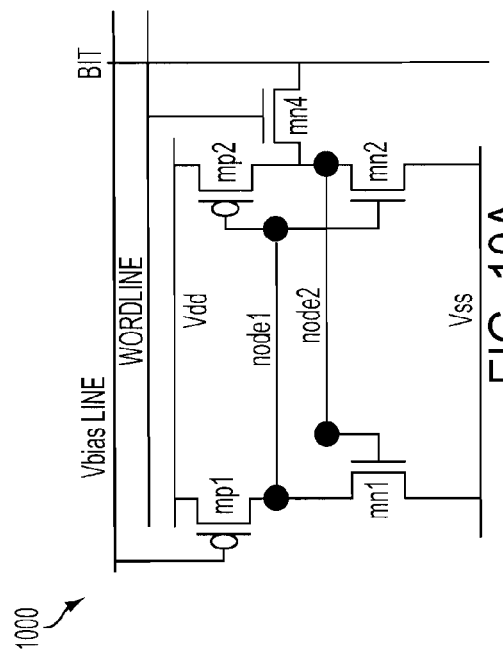

NEUTRON DETECTOR CELL EFFICIENCY

CROSS-REFERENCE TO RELATED APPLICATIONS

The present application claims priority to U.S. Provisional Patent Application No. 61/148,448 filed on Jan. 30, 2009 titled "Improved Neutron Detector Cell Efficiency", the entire contents of which are incorporated herein for all purposes.

GOVERNMENT RIGHTS

The United States Government has acquired certain rights in this invention pursuant to Contract No. N00173-08-C-6013, awarded by the U.S. Naval Research Laboratory.

FIELD OF THE INVENTION

The present invention relates to a structure for providing sensitive detection capability for neutrons, and more particularly, to a sensor detector component of a neutron detection structure that is low cost, low power, able to be mass-produced, and makes efficient use of the silicon area.

BACKGROUND OF THE INVENTION

The threat of large scale terrorist attacks has resulted in an increased interest in methods for the detection of weapons of mass destruction and their related materials for homeland security. Of particular interest are passive detection systems (meaning non-intrusive devices detecting the proximity of certain materials), which, if they can be mass produced at low cost and low power, afford the broadest deployment and therefore the most coverage and security. Because radioactive material emits neutrons while self-fissioning, a passive neutron detection device is of particular interest for the detection of clandestine nuclear material.

Recently a semiconductor-based solid state neutron detector has been proposed in which a "neutron conversion layer" (a layer containing a material such as boron isotope 10B which is understood to efficiently react with neutrons to generate high energy charged particles) is placed in very close proximity to an array of charge-sensitize circuits, such as a DRAM memory cell, a FLASH memory cell, or an SRAM memory cell. An industry standard 6-transistor (6T) SRAM cell 100 is illustrated in FIG. 1. For example, U.S. Pat. Nos. 6,867,444 and 7,271,389, assigned to the United States Navy, sets forth two such neutron detection devices and are hereby incorporated by reference herein in their entireties. The 10B doped film reacts with incident neutrons to produce alpha particles that generate charge in the memory cell silicon and cause binary state changes known as single event upsets (SEUs). The upsets, and thus the presence of neutrons, are detected by periodically scanning the memory array and comparing it to the originally loaded data pattern Though an SRAM, DRAM, or non-volatile memory array may accomplish the above task, it may not be the most ideal candidate for the cell that monitors charged particle induced behavior change. For example, SRAM cells are designed to support random read and write access of individual memory cells (bits) and to store random data patterns. None of this functionality is required for the detection of charge generation and collection; all that is needed is a circuit array that can be periodically scanned for evidence of "hits" by the charged particles generated in the neutron conversion layer.

Further, an SRAM cell is designed for minimum area, and while sufficiently small cells are important, individual circuit cell size is not the real priority. The most important aspect for achieving a low-cost, low-power, mass-producible neutron detection device is the efficiency of the silicon area used. Referring to the case where the neutron conversion layer contains boron isotope 10B and the product of the reaction is alpha particles, the silicon area used by the SRAM cell, for example, is typically very large compared to the cross sectional area that is actually sensitive to a strike by an alpha particle. An area efficiency term can be defined as: the memory cell silicon area in which an alpha particle can induce an upset divided by the total memory cell silicon area. For a charge-sensitive circuit cell ideal for the neutron detector application this ratio would approach 1; in the case of the SRAM cell this ratio may in fact be less than 0.05. And thus 95% of the silicon is wasted, increasing cost, area, and power.

Therefore, it would be desirable to provide an array of semiconductor circuits used in a neutron detection device that makes more efficient use of the silicon area, uses less power, is low cost, and is able to be mass produced.

SUMMARY

Three types of circuit arrays that have an improved area efficiency, as defined above, and can be used to detect and count the alpha particles as they "hit" the circuit are: (1) state latching circuits; (2) glitch generating circuits; and (3) charge loss circuits.

State latching circuits are single event upset based and store the binary state change for later readout. These circuits allow for very infrequent reads as well as a spatial mapping of the upsets. Unneeded transistors and signal lines are removed from an SRAM cell to create the desired circuit.

Glitch generating circuits, or edge producing cells, create a rising or falling edge for each upset detected. The upset is not latched as in the previous example, but instead intended to trigger a counting circuit. These circuits can most likely realize a higher area efficiency as well as read "hits" in real time. The charge required to cause sufficient current to flow through a device (transistor, BJT, diode, etc.) to produce a glitch, or upset, referred to as Qcrit, is lower with this method.

Charge loss circuits create charge leakage on a node in response to charged particle (i.e., alpha particle) intrusion. The observable circuit change can be cell current, threshold voltage, change in voltage on the bit-line during a read, a floating body effect, etc.

BRIEF DESCRIPTION OF THE DRAWINGS

FIG. 1 illustrates an industry standard 6T SRAM cell.

FIGS. 2-13 illustrate state latching charged particle detectors according to embodiments of the present invention.

FIGS. 14-21 illustrate glitch generating charged particle detectors according to embodiments of the present invention.

DETAILED DESCRIPTION

Introduction

The embodiments described herein provide circuit arrays and corresponding methods to detect charged particle intrusion for use in a neutron detection structure that make the most efficient use of the silicon area, are low cost, low power, and able to be mass produced. In general, the circuits are composed of p-channel and n-channel MOSFETs with various embodiments including resistors, capacitors, diodes, and BJTs.

State Latching Circuits

FIG. 2a illustrates a circuit 200 according to an embodiment of the present invention. This circuit 200 is essentially a one-state memory cell lacking a second bitline, and second enable select transistor. Initial writing of the cell is performed by driving the bitline to Vss and enabling mn4 by driving the wordline. Node2 is therefore driven to Vss thus turning off mn1 and turning on mp1. Turning on mp1 drives node1 to Vdd, thus turning on mn2 and ensuring node2 remains at Vss. Incident charged particles will cause a channel to open in mn1 upsetting the latch by driving mp2 and thus storing Vdd on node 2. A readout of the bit line would indicate if a charged particle had changed the state of the cell. The body of mn1 can be left floating or tied to Vss (not shown). If the body is left floating, deposited charge will multiply making the cell easier to upset.

In some alternate embodiments, mp1 can be weakened as well to increase the ability for a charged particle to upset the latch. Several techniques exist for weakening a p-channel MOSFET including implant, backbias, drawn geometry, increased gate oxide thickness, and gate doping, as well as other methods well known in the art.

Circuit 200 is configured as a "write-zero" device, i.e. a "zero", or low (Vss) voltage is written to node2 through the bitline. Upsets appear as "ones" at node2. This circuit 200 could just as easily be implemented as a "write-one" device without departing from the scope of the invention. Such a device is shown as circuit 202 in FIG. 2b. Here, a "one", or high (Vdd) voltage is written into node2 through the bitline. Upsets appear as "zeros" (Vss) on node2. In circuit 202, mn1 can be weakened as well to increase the ability of a charged particle to upset the latch.

Figure 3A:
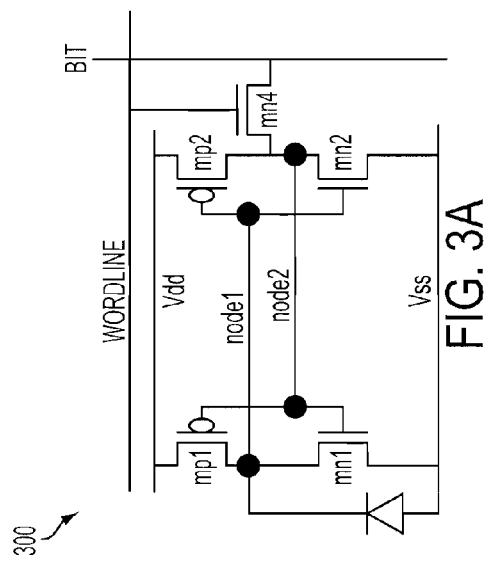
Figure 4A:
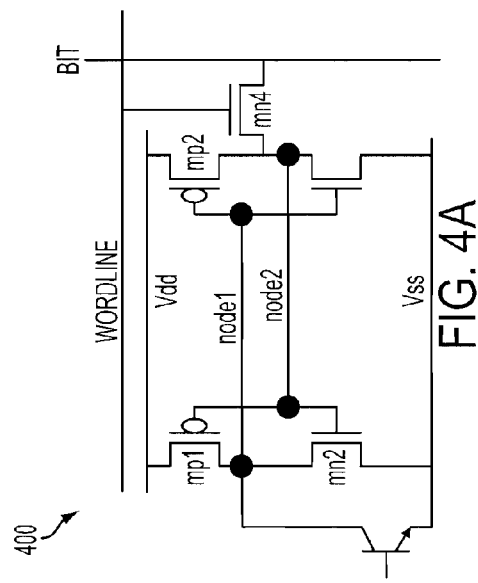

FIGS. 3a, 4a, and 5a illustrate circuits 300, 400, and 500 corresponding to further embodiments of the present invention. A charge collector in the form of a diode in FIG. 3a, a BJT in FIG. 4a, and a MOSFET in FIG. 5a is added to the circuit 200 of FIG. 2a, in parallel with mn1, as an additional target upset device. The diode should be designed to maximize sensitive volume and charge generation while minimizing the additional capacitance ($Q_{crit}$). The base of the BJT can be floating or it can be tied to Vss (not shown). If the base is left floating, deposited charge will multiply. In FIG. 5a, the MOSFET is shown as an nFET having a gate terminal coupled to Vss, however it should be noted that one could substitute this for a pFET having a gate terminal coupled to Vdd. The gate of the MOSFET can be tied to ground (Vss) or an additional wordline-type bus for testing (not shown). The bulk connection (not shown) of the MOSFET can either be tied to ground or left as "floating body", in which case the deposited charge will be multiplied by the gain of the parasitic npn inherent to the n-channel transistor.

It should be noted that mp1 can be weakened in each of the above embodiments as well utilizing the aforementioned weakening methods. It should also be noted that each of the above embodiments are not limited to one collector device per cell; multiple collector devices can be utilized in the same cell.

Figure 3B:
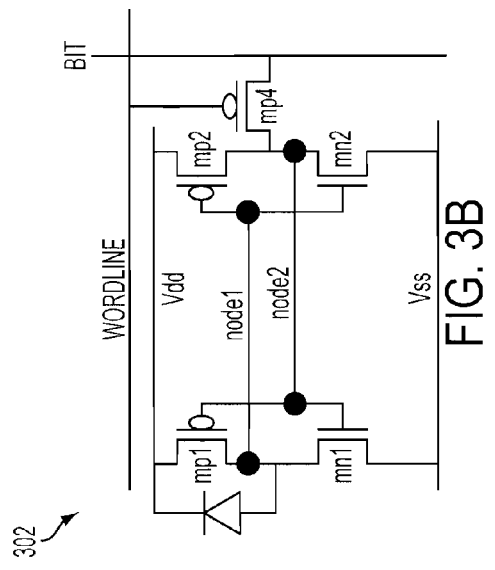
Figure 4B:
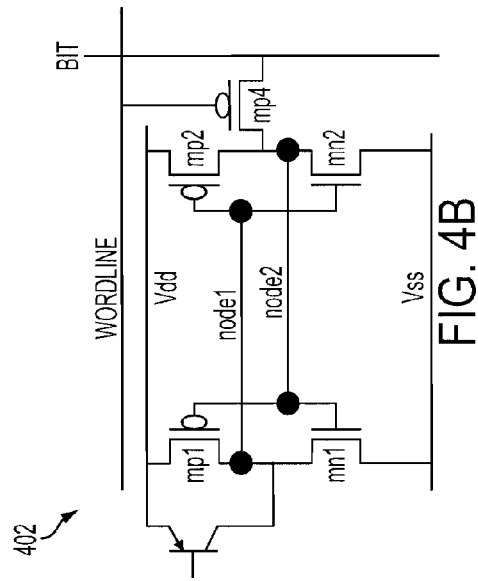
Figure 7A:
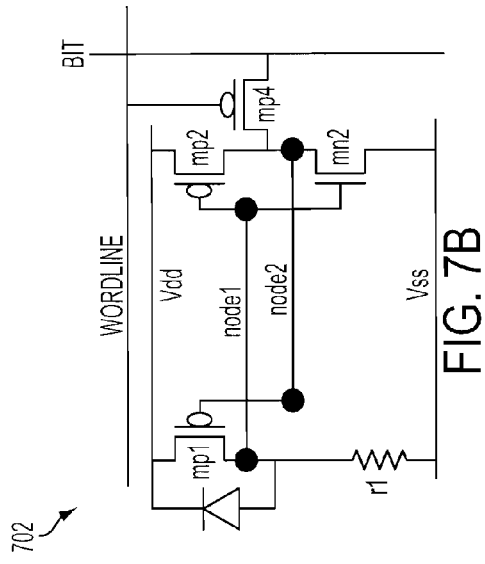
Figure 7B:
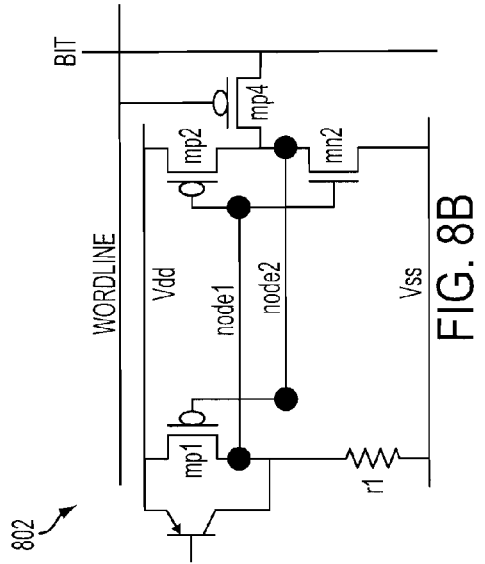
Figure 8A:
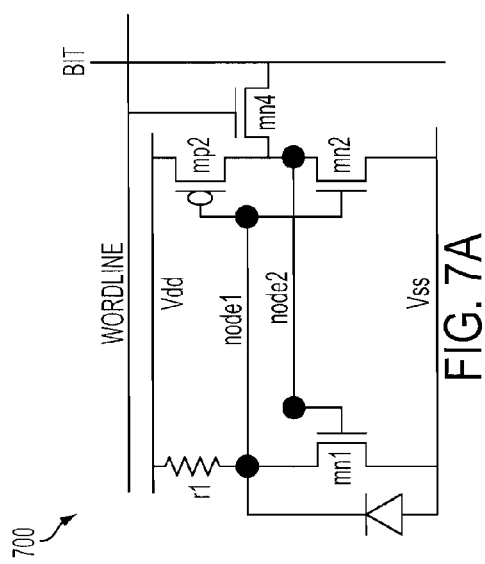
Figure 8B:
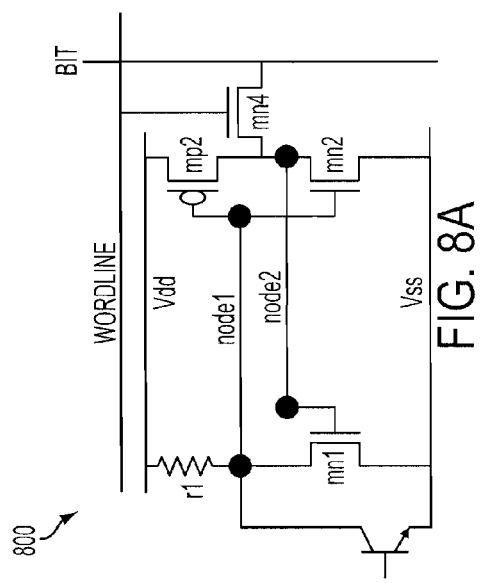

FIGS. 3b, 4b, and 5b illustrate the "write-one" versions 302, 402, and 502 of the "write-zero" circuits 300, 400, and 500. It should be noted that in the "write-one" circuits 302, 402, and 502, mn1 can be weakened to increase the ability of a charged particle to upset the latch.

FIGS. 6a, 7a, 8a, and 9a illustrate circuits 600, 700, 800, and 900 according to further embodiments of the present invention. Mp1 in the circuit 200 may be replaced with a very large resistor as illustrated in circuit 600 of FIG. 6a. The resistance of R1 may be 100 kΩ or greater. A large R1 will slow node1's recovery and make the cell easier to upset. Once the cell has been upset, DC current will flow in the Vdd line possibly providing an alternate means for determining when a certain number of cells have been upset. Charge collector devices can also be added in parallel to mn1 illustrated in circuits 700, 800, and 900 of FIGS. 7a, 8a, and 9a respectively, similar to circuits 300, 400, and 500.

FIGS. 6b, 7b, 8b, and 9b illustrate the "write-one" versions 602, 702, 802, and 902 of the "write-zero" circuits 600, 700, 800, and 900.

Figure 11A:
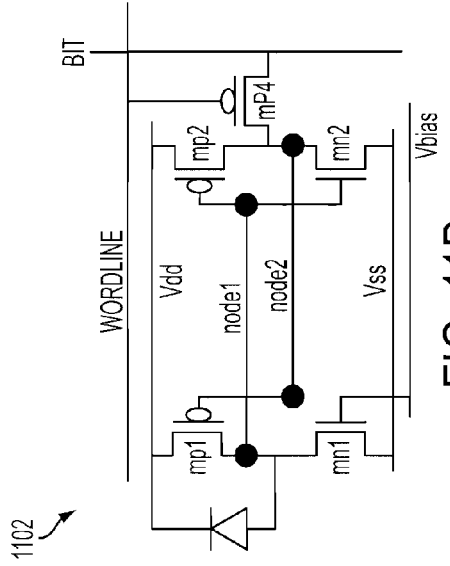
Figure 12A:
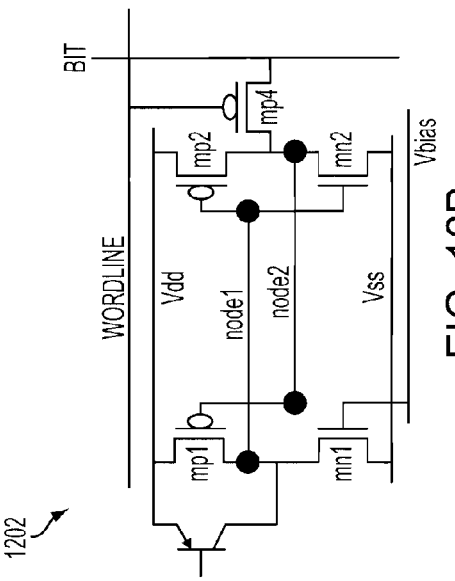
Figure 11B:
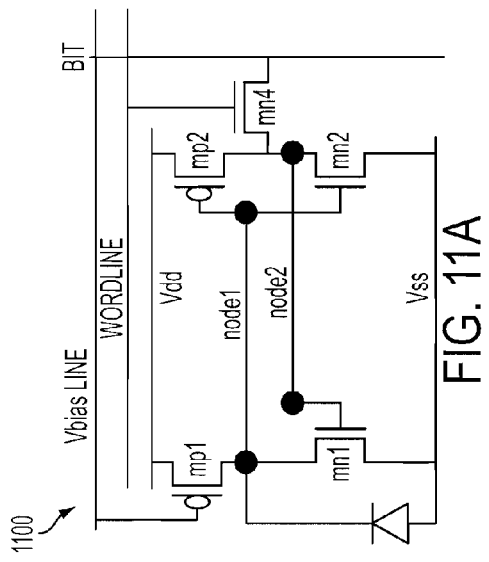
Figure 12B:
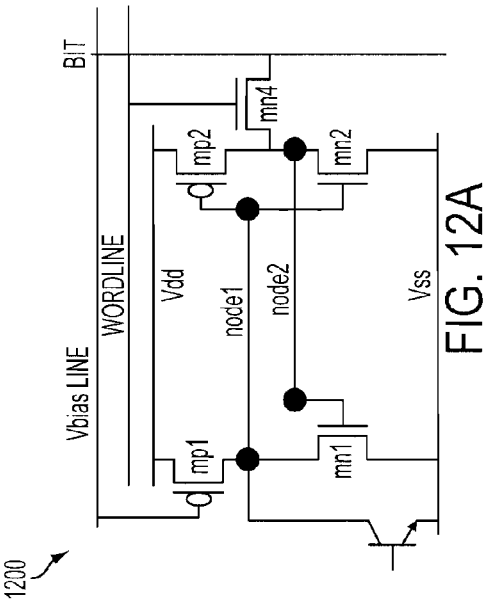

FIG. 10a illustrates a circuit 1000 according to another embodiment of the present invention. In this embodiment, the gate of mp1 is tied to a Vbias line instead of to node2. The Vbias line is used set the recovery current of mp1 and thus sensitivity of the cell, and may also be employed to assist in the setup and reset of the cell. Again, DC current will flow in the Vdd line for upset cells which can possibly provide an alternate means for determining when a certain number of cells have been upset. Charge collector devices can also be added in parallel to mn1, as illustrated in circuits 1100, 1200, and 1300 of FIGS. 11a, 12a, and 13a respectively, similar to circuits 300, 400, and 500. In each of circuits 1000, 1100, 1200, and 1300, mp1 can be optionally weakened to increase the ability of a charged particle to upset the latch.

FIGS. 10b, 11b, 12b, and 13b illustrate the "write-one" versions 1002, 1102, 1202, and 1302 of the "write-zero" circuits 1000, 1100, 1200, and 1300. In these "write-one" circuits, mn1 can be optionally weakened to increase the ability of a charged particle to upset the latch.

Glitch Generating Cells

Figures 13A, 13B, 14A, 14B:
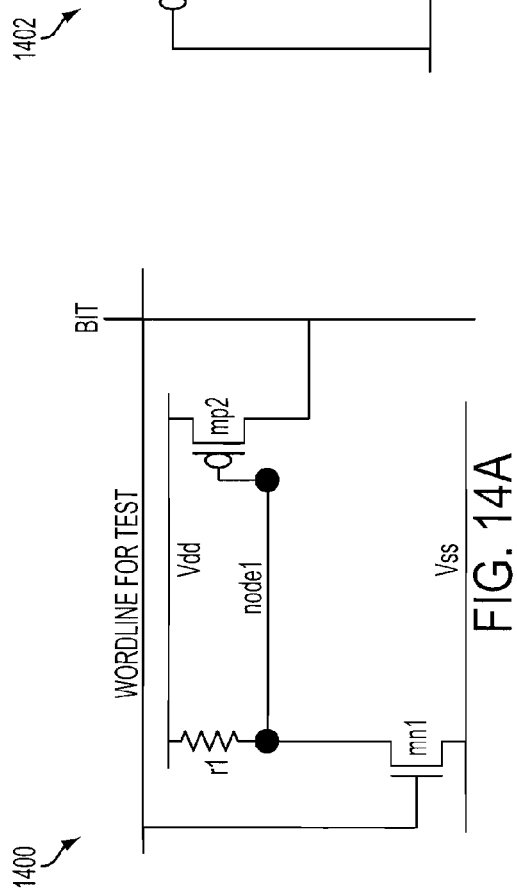

FIGS. 14a illustrates circuit 1400 according to a further embodiment of the present invention. This circuit is intended to produce a glitch, or a rising edge, on the bitline for each upset. Mn1 can be one or more charge collecting MOSFETs with the bulk connection (not shown) tied to Vss or left as "floating body". If left as floating body, the deposited charge will be multiplied by the gain of the parasitic npn inherent to the n-channel transistor. Circuit 1400 illustrates a glitch generating cell with a resistor R1 coupled between Vdd and node1. The value of R1, which may be 100 kΩ or more, is chosen such that the charging time to bring node1 back to Vdd after an upset is long enough to produce a rising edge on the bit line. The wordline is kept low and used for testing the array. The bit line is held low but is high impedance, and may be tied to a counting circuit. A charged particle strike on transistor mn1 will cause the voltage on node 1 to collapse to Vss, turning on transistor mp2, thus producing a rising edge on the bit line. Many cells, possibly even several rows, can share a common bitline and detect circuit. The limitation is that the "on" current of mp2 must be sufficient to drive the aggregate bitline capacitance to a detectable voltage level before node1 can recover from the charged particle strike. Because the cells are not individually accessed there is no means to detect which cell received the alpha particle strike, thus some information about the location of the neutron penetration is lost.

Figure 15A:
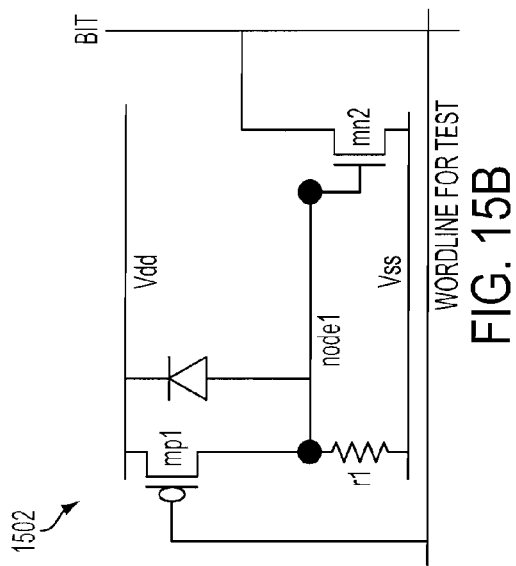
Figure 15B:
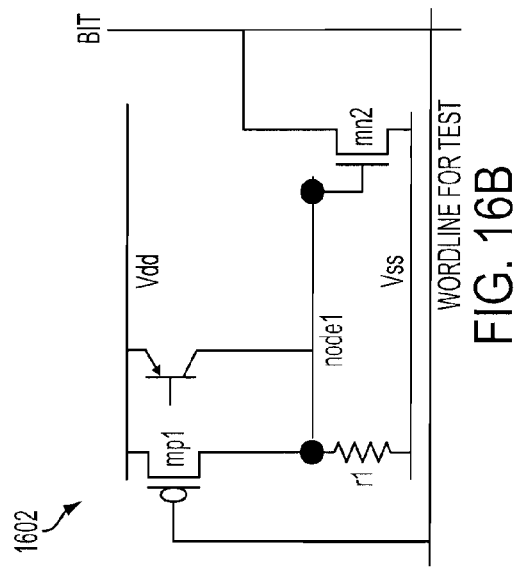
Figure 16A:
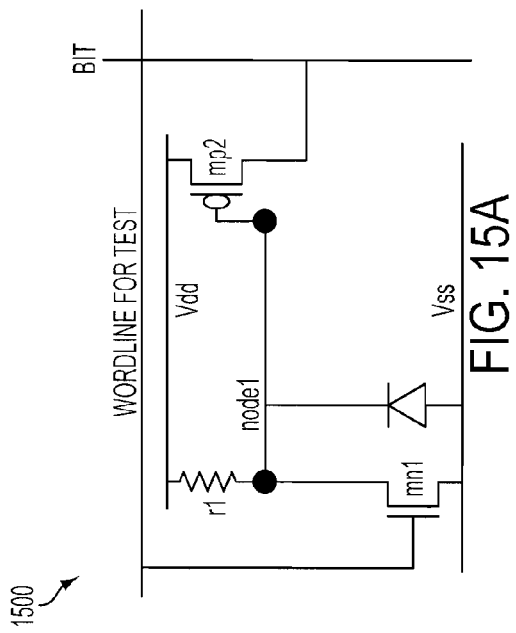
Figure 16B:
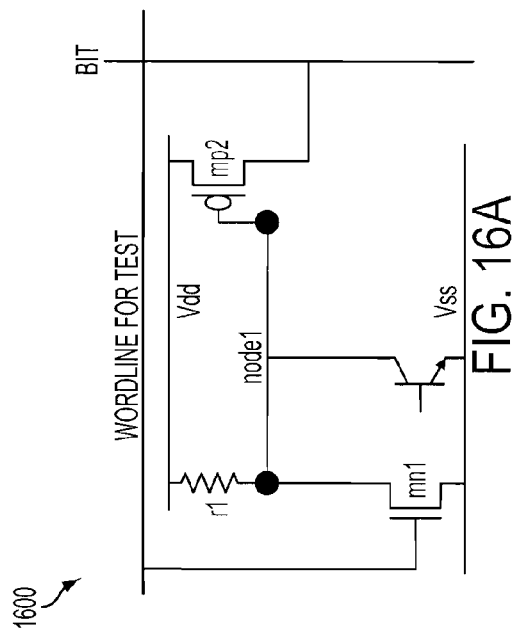
Figure 17A:
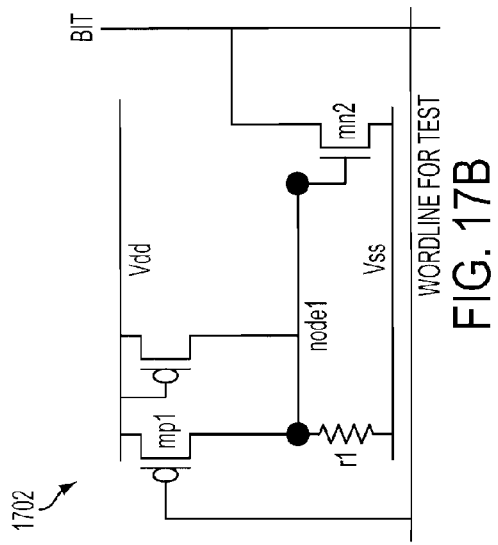

Charge collector devices can also be added in parallel to mn1, as illustrated in circuits 1500, 1600, and 1700 of FIGS. 15a, 16a, and 17a respectively, similar to circuits 300, 400, and 500. In circuit 1600, the base of the BJT can be floating or it can be tied to Vss (not shown). If the base is left floating, deposited charge will multiply. The gate of the MOSFET in circuit 1700 can be tied to ground (Vss) or an additional wordline-type bus for testing (not shown). The bulk connection (not shown) of the MOSFET can either be tied to ground or left as "floating body", in which case the deposited charge will be multiplied by the gain of the parasitic npn inherent to the re-channel transistor.

The circuits 1400, 1500, 1600, and 1700 produce rising edges on the bit line each time a particle strike is detected, but these circuits could just as easily produce falling edges on the bitline instead. FIGS. 14b, 15b, 16b, and 17b illustrate the "falling-edge" versions 1402, 1502, 1602, and 1702 of the "rising-edge" circuits 1400, 1500, 1600, and 1700.

Figure 18A:
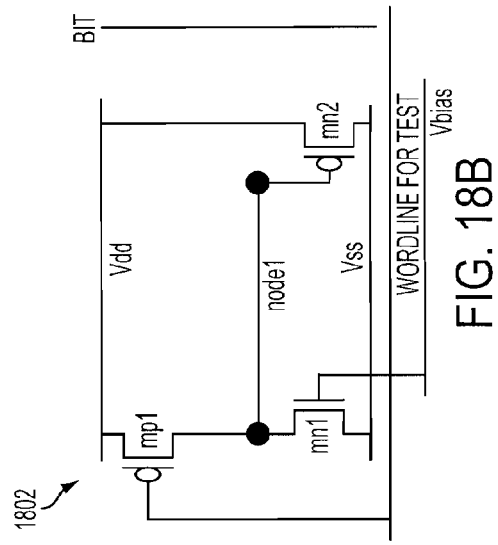
Figure 17B:
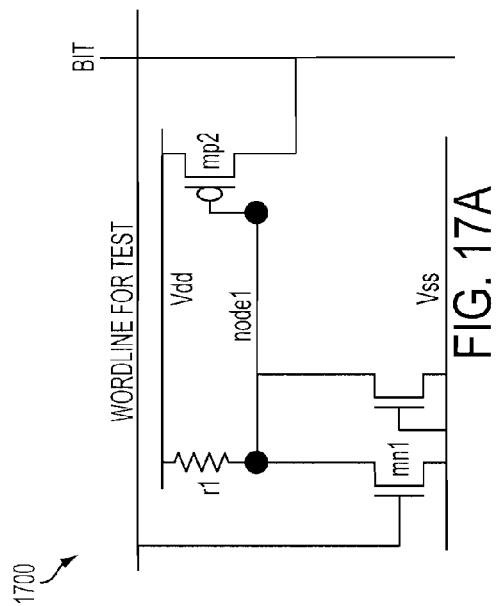
Figure 18B:
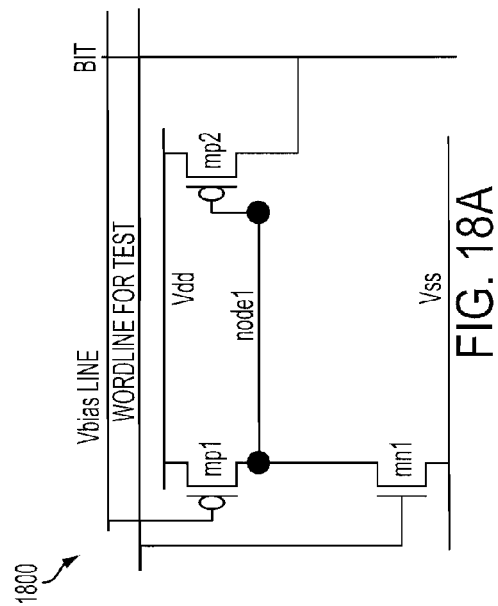

FIG. 18a illustrates a circuit 1800 according to another embodiment of the present invention. The principle in this circuit is the same as that of circuit 1400, but the resistor is replaced with a biased p-channel transistor. Similar to that of circuit 1000, the Vbias line is used to set the recovery current of mp1 and thus the sensitivity of the cell, and may also be employed to assist in the setup and testing of the cell.

Figure 19A:
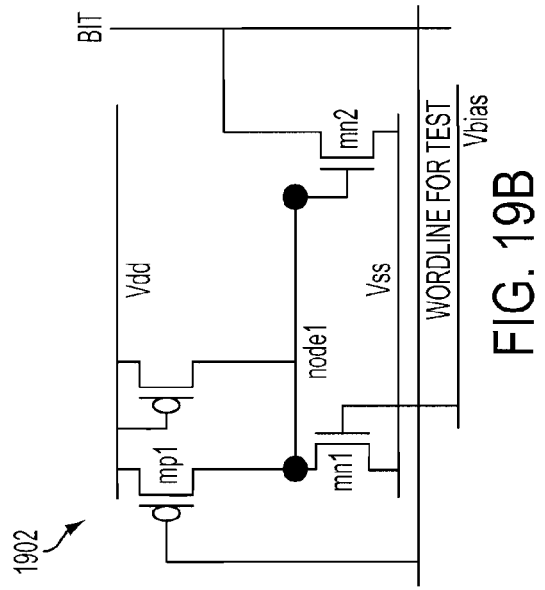
Figure 19B:
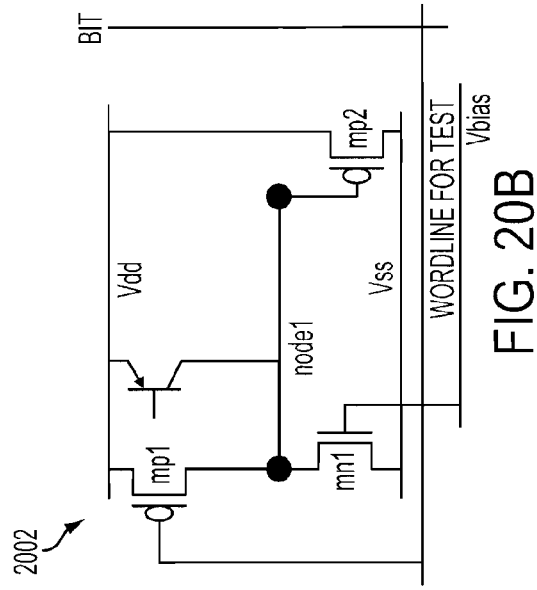
Figure 20A:
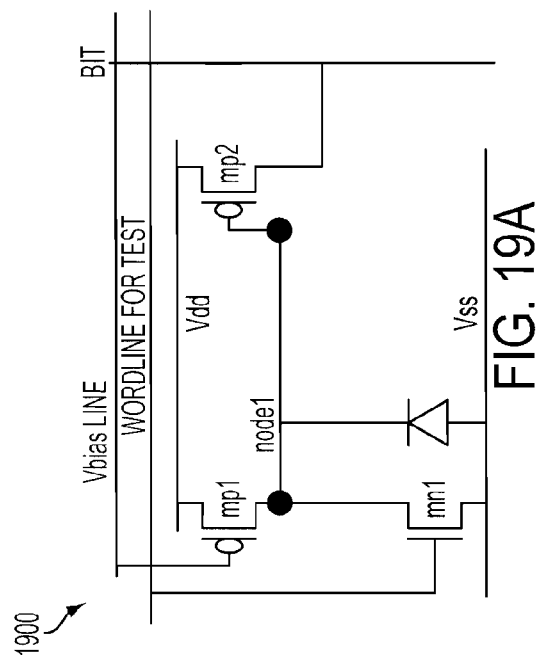
Figure 20B:
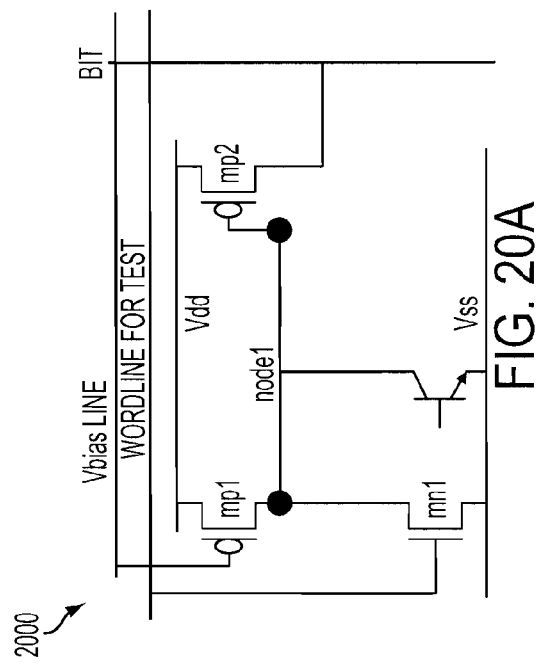
Figure 21A:
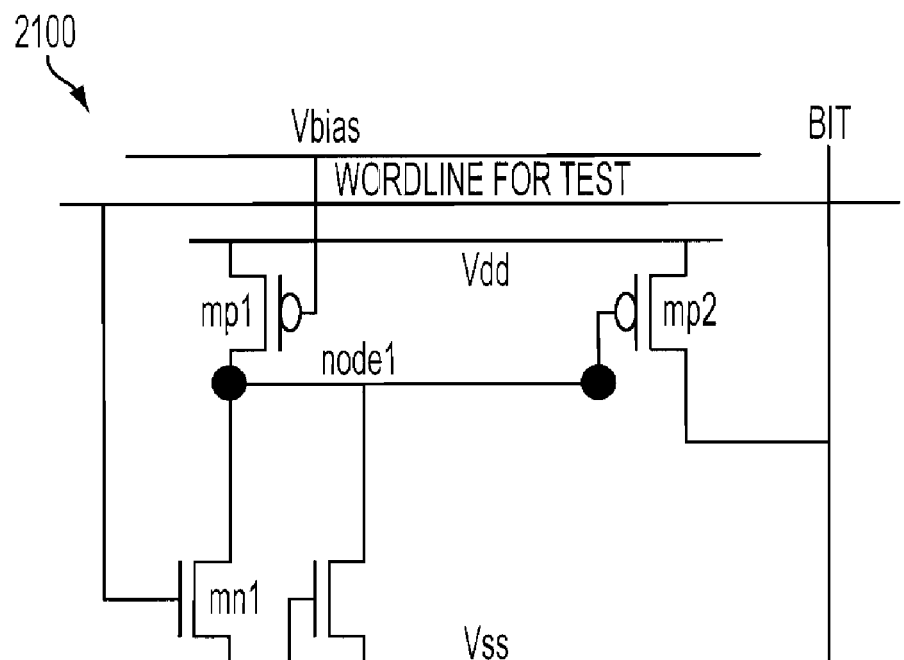
Figure 21B:
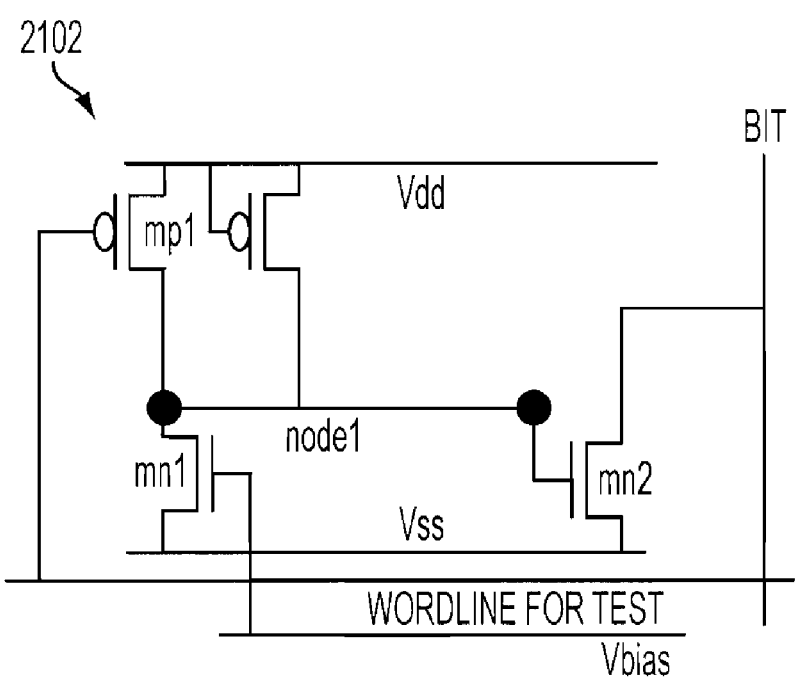

FIGS. 19a, 20a, and 21a illustrate circuits corresponding to circuit 1800 in which charge collectors have been placed in parallel with mn1. FIGS. 18b, 19b, 20b, and 21b illustrate the "falling-edge" versions 1802, 1902, 2002, and 2102, of the "rising-edge" circuits 1800, 1900, 2000, and 2100.

Charge Loss Circuits

Figure 22:
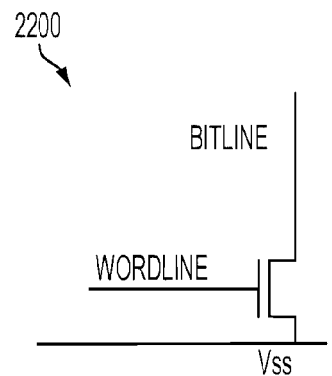
FIG. 22 illustrates a charge loss charged particle detector according to an embodiment of the present invention.

FIG. 22 illustrates a circuit 2200 according to another embodiment of the present invention. This circuit is constructed as an array of partially-depleted floating-body SOI transistors (though only one is shown) with drains coupled to bit lines and sources coupled to Vss. The floating body serves as the storage node which will be affected by the charged particle intrusion. By adjusting the biases on the bitline, the wordline, and the Vss line, the floating body potential may be charged either positive (lowering the threshold potential) or negative (increasing the threshold potential). Because the array is simply set-up for "hits" and not storing random data patterns, to whatever degree the setup currents permit the entire array may be "set-up" in a single parallel operation. After "set-up" the bias conditions on the bitline, wordline, and Vss line are set so as to maximize the retention time of the stored state, this being detection mode. If a charged particle penetrates the channel of the transistor, electron-hole pairs will be generated, significantly altering the body potential and thus the threshold voltage of the transistor. Wordline and bitline voltages are optimized for the read operation to discriminate between a cell which is intact compared with a cell which has experienced a charged particle intrusion. Similar to most DRAM implementations, a read is most likely destructive of the stored or "upset" state, and retention time of the stored state is limited, so the array needs to be scanned and "re-set-up" (i.e., refreshed) somewhat frequently. Depending upon bias conditions, in some implementations it may be possible to have the read operation and the reprogram (i.e., re-set-up) operation be essentially the same operation, or at least performed at the same time. While this floating-body single transistor body charge storage implementation has the disadvantages of requiring frequent reads and refreshes, the Qcrit is very low and the cross sectional efficiency may be very high.

Figure 23:
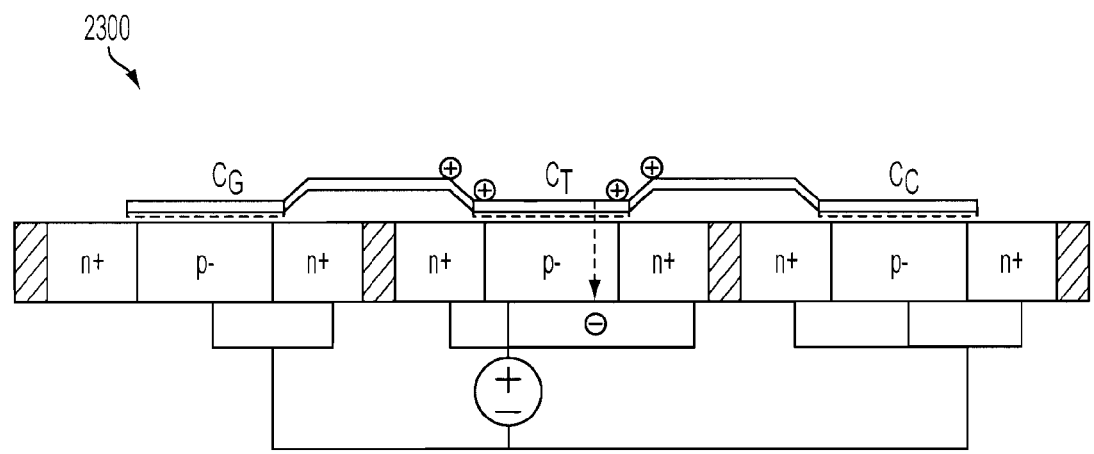
FIG. 23 illustrates a charge loss charged particle detector according to another embodiment of the present invention.
Figure 24A:
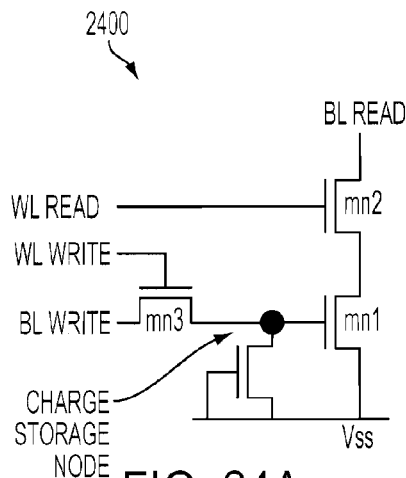
FIGS. 24-26 illustrate charge loss charged particle detectors according to further embodiments of the present invention.
Figure 24B:
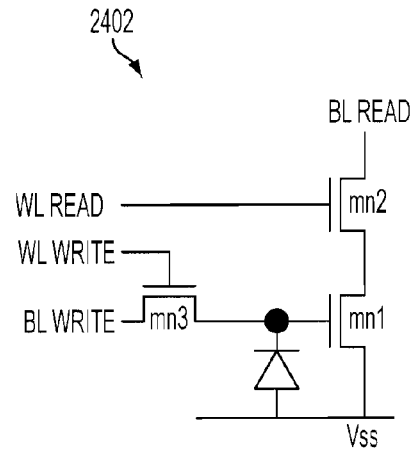
Figure 24C:
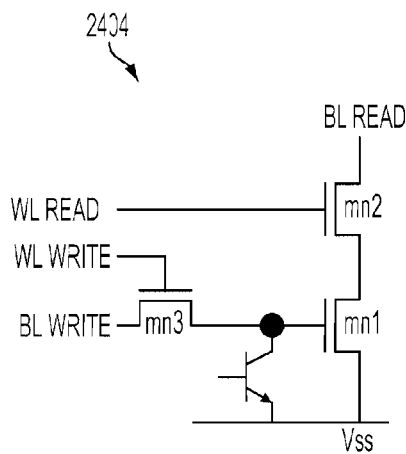
Figure 24D:
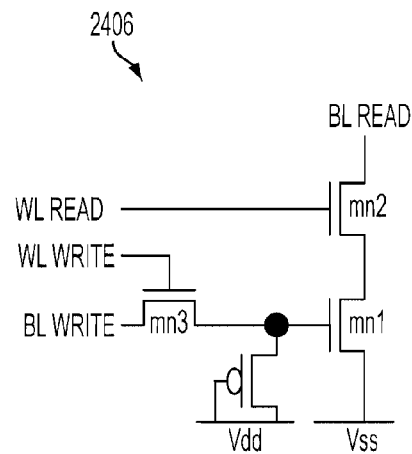
Figure 24E:
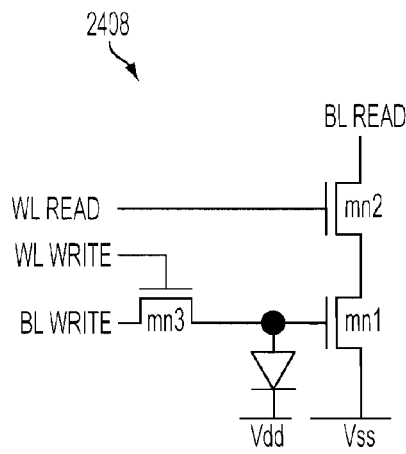
Figure 24F:
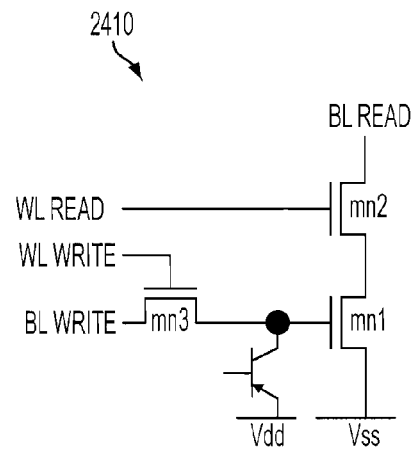

In another embodiment of the present invention a charge storage memory device such as floating gate, nitride storage (SONOS), nano-crystal, or nano metal particle device is used. FIG. 23 details a specific case in which a floating gate EEPROM device, such as the one described in commonly owned U.S. Pat. No. 7,378,705, is used. As power is applied to the device 2300, a "one" is written to a full array of memory cells by passing F-N tunneling currents through the gate oxide into a MOS capacitor. Power is removed and the device enters a passive detection mode. Charged particles that pass through the gate oxide generate electron-hole pairs, some of which recombine and some of which transport to discharge the capacitor. Upon readout, the number of failing cells is compared to a threshold value based on the number of naturally occurring failing cells to determine the presence of charged particles. Other examples of floating gate device structures include: EPROM, NOR flash, NAND flash, and EEPROM such as the one described in commonly owned U.S. Pat. No. 7,378,705.

FIGS. 24a-f illustrate circuits 2400-2410 according to further embodiments of the present invention. The cell current read on the bitline depends upon the charge stored on the charge storage node. Charged particle intrusion will affect the charge on this node and thus the read current. Multiple charge collecting devices can be used including a MOSFET, diode, and a BJT. Circuits 2400, 2402, and 2404 illustrate charge collectors that discharge low while circuits 2406, 2408, and 2410 illustrate charge collectors that discharge high.

Figure 25A:
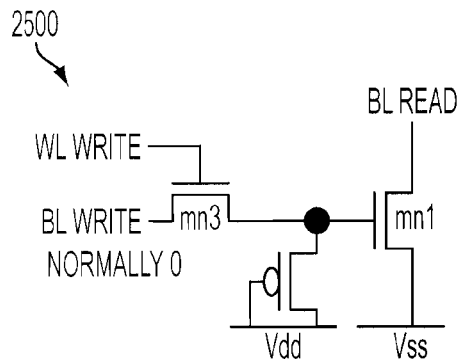
Figure 25B:
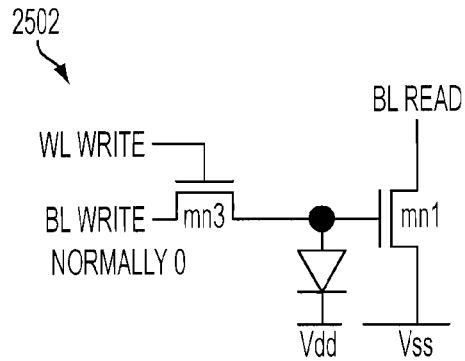
Figure 25C:
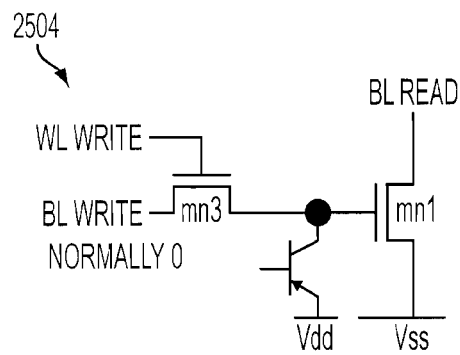

FIGS. 25a-c llustrate circuits 2500-2504 according to further embodiments of the present invention. These circuits are similar to those of FIG. 24a-c except that the read select transistors are removed.

Figure 26A:
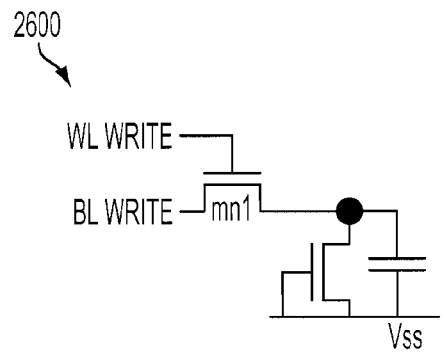
Figure 26B:
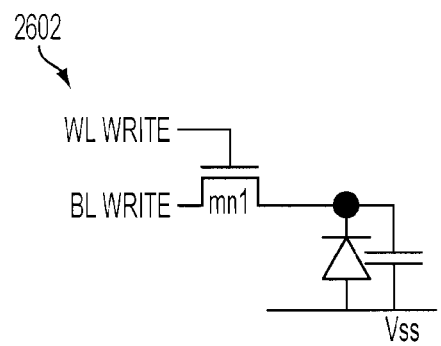
Figure 26C:
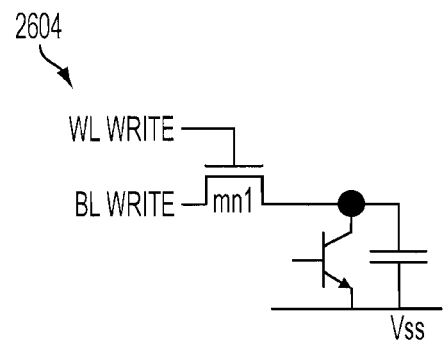

FIGS. 26a-c illustrate circuits 2600-2604 according to further embodiments of the present invention. These circuits are similar to those of FIGS. 25a-c except the read bitline is replaced with a capacitor. Charge loss induced by incident charged particles creates a variable voltage drop across the capacitor.

It should be understood that the above embodiments are not limited to a specific process technology, namely an SOI or a Bulk Silicon process, but rather intended to be utilized with a variety of process technologies. Such technologies may include Bulk (junction isolated) CMOS or BICMOS, SOI (oxide insulated) CMOS or BICMOS including: floating-body SOI, body-tie SOI, an SOI employing a mix, and partially depleted or fully depleted SOI, thick or thin SOI, junction isolated implemented on thick SOI, or CMOS based non-volatile technologies.

While certain features and embodiments of the present application have been described in detail herein, it is to be understood that the application encompasses all modifications and enhancements within the scope and spirit of the following claims.

The invention claimed is:

1. A charged particle detector comprising:
   first and second voltage sources;
   a signal node;
   one and only one bitline for reading and writing signals to the charged particle detector;
   a first transistor coupled between the first voltage source and the bitline, the first transistor having a gate terminal coupled to the signal node;
   a second transistor coupled between the second voltage source and the signal node; and a circuit element coupled between the first voltage source and the signal node, wherein the circuit element comprises a third transistor, the third transistor having a gate terminal coupled to a third voltage source, and whereby charged particles incident upon the second transistor create a conduction path between the second voltage source and the signal node and temporarily apply a voltage of the second voltage source to the signal node.

2. The charged particle detector of claim 1, wherein the second transistor has a floating body.

3. The charged particle detector of claim 1, further comprising a charge collector coupled between the second voltage source and the signal node, wherein the charge collector is selected from the group consisting of a diode, a BJT, and a MOSFET.

4. The charged particle detector of claim 1, wherein the signal node is a first signal node, and wherein the second transistor has a gate terminal coupled to a second signal node, and wherein the charged particle detector further comprises:

a third transistor coupled to the first transistor forming an inverter, the inverter coupled between the first and second voltage sources, and the inverter having an input coupled to the first signal node and an output coupled to the second signal node;

a fourth transistor coupled between the bitline and the first transistor, the fourth transistor having a gate terminal coupled to a wordline.

5. A method of detecting the presence of charged particles, the method comprising:

providing a latch, the latch comprising one and only one bitline, first and second voltage sources, first and second signal nodes, and first and second inverters, each inverter comprising a pFET and an nFET, wherein each inverter is coupled between the first and second voltage sources, wherein the first signal node is coupled between an input of the first inverter and an output of the second inverter, wherein the second signal node is coupled between an input of the second inverter and an output of the first inverter, wherein the first signal node has a voltage that is generally equal to a voltage of the first voltage source, and wherein the second signal node has a voltage that is generally equal to a voltage of the second voltage source;

multiplying a charge deposited by the charged particles by floating a body of at least one of the pFET and nFET that comprise the second inverter;

coupling a charge collector between the first signal node and the second voltage source, wherein the charge collector is selected from the group consisting of a diode, a BJT, and a MOSFET, and whereby charged particles incident upon the charge collector create a conduction path between the first signal node and the second voltage source and act to upset the latch; and reading the voltage of the second signal node onto the bitline, the voltage indicating whether an upset has occurred.

6. A method of detecting the presence of charged particles, the method comprising:

providing a charged particle detector, the charged particle detector comprising a first transistor coupled between a first voltage source and a bitline, the first transistor having a gate terminal coupled to a signal node;

a circuit element coupled between the first voltage source and the signal node, the circuit element including a conduction path between the first voltage source and the signal node, wherein the circuit element is selected from the group consisting of a resistor and a transistor having a gate terminal coupled to a Vbias line;

a second transistor coupled between a second voltage source and the signal node, whereby charged particles incident upon the second transistor create a conduction path between the second voltage source and the signal node and temporarily apply a voltage of the second voltage source to the signal node, and whereby the voltage of the second voltage source appearing on the signal node acts to temporarily apply a voltage of the first voltage source to the bitline; and monitoring a voltage on the bitline, whereby the presence of charged particles is indicated by a temporary voltage appearing on the bitline that is substantially equal to the voltage of the first voltage source.

7. The method of claim 6, wherein the charged particle detector further comprises a charge collector coupled between the signal node and the second voltage source, wherein the charge collector is selected from the group consisting of a diode, a BJT, and a MOSFET, and whereby charged particles incident upon the charge collector create a conduction path between the second voltage source and the signal node and temporarily apply the voltage of the second voltage source to the signal node.

8. A charged particle detector comprising:

first and second voltage sources;

a signal node;

one and only one bitline for reading and writing signals to the charged particle detector;

a first transistor coupled between the first voltage source and the bitline, the first transistor having a gate terminal coupled to the signal node;

a second transistor coupled between the second voltage source and the signal node; and a circuit element coupled between the first voltage source and the signal node, wherein the circuit element comprises a resistor.

9. The charged particle detector of claim 8, wherein the resistor has a resistance value of not less than 100 kΩ.

10. The charged particle detector of claim 8, further comprising a charge collector coupled between the second voltage source and the signal node, wherein the charge collector is selected from the group consisting of a diode, a BJT, and a MOSFET.

11. The charged particle detector of claim 8, wherein the second transistor has a floating body.

12. The charged particle detector of claim 8, wherein the signal node is a first signal node, and wherein the second transistor has a gate terminal coupled to a second signal node, and wherein the charged particle detector further comprises:

a third transistor coupled to the first transistor forming an inverter, the inverter coupled between the first and second voltage sources, and the inverter having an input coupled to the first signal node and an output coupled to the second signal node;

a fourth transistor coupled between the bitline and the first transistor, the fourth transistor having a gate terminal coupled to a wordline.

13. A charged particle detector comprising:

first and second voltage sources;

a signal node;

one and only one bitline for reading and writing signals to the charged particle detector;

a first transistor coupled between the first voltage source and the bitline, the first transistor having a gate terminal coupled to the signal node;

a second transistor coupled between the second voltage source and the signal node; and a third transistor coupled between the first voltage source and the signal node, wherein the third transistor comprises a weakened pFET or a weakened nFET.

14. The charged particle detector of claim 13, wherein the second transistor has a floating body.

15. The charged particle detector of claim 13, further comprising a charge collector coupled between the second voltage source and the first signal node, wherein the charge collector is selected from the group consisting of a diode, a BJT, and a MOSFET.

16. The charged particle detector of claim 13, wherein the signal node is a first signal node, wherein the second transistor has a gate terminal coupled to a second signal node, wherein the third transistor has a gate terminal coupled to the second signal node, and wherein the charged particle detector further comprises:

a fourth transistor coupled to the first transistor forming an inverter, the inverter coupled between the first and second voltage sources, and the inverter having an input coupled to the first signal node and an output coupled to the second signal node; and a fifth transistor coupled between the bitline and the first transistor, the fifth transistor having a gate terminal coupled to a wordline.

* * * * *